(12) United States Patent
Mustafa et al.

(10) Patent No.: US 12,224,195 B2
(45) Date of Patent: Feb. 11, 2025

(54) CENTERING WAFER FOR PROCESSING CHAMBER

(71) Applicant: Applied Materials, Inc., Santa Clara, CA (US)

(72) Inventors: Muhannad Mustafa, Milpitas, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 130 days.

(21) Appl. No.: 17/879,074

(22) Filed: Aug. 2, 2022

(65) Prior Publication Data
US 2024/0047256 A1    Feb. 8, 2024

(51) Int. Cl.
H01L 21/68      (2006.01)
B25B 11/00      (2006.01)
H01L 21/683     (2006.01)

(52) U.S. Cl.
CPC ............ H01L 21/68 (2013.01); B25B 11/005 (2013.01); *H01L 21/6833* (2013.01); *H01L 21/6838* (2013.01)

(58) Field of Classification Search
CPC . H01L 21/68; H01L 21/6833; H01L 21/6838; B25B 11/005
See application file for complete search history.

(56) References Cited

U.S. PATENT DOCUMENTS 9,123,510 B2     9/2015  Nakano et al.
11,201,078 B2 *  12/2021 Matsushita ......... H01L 21/6838

2002/0074020 A1* 6/2002  Ono ................ H01L 21/67034
                                                    134/21
2005/0065634 A1* 3/2005  Nakajima .......... H01L 21/6875
                                                    700/213
2006/0208749 A1* 9/2006  Otaguro ................ H01L 21/68
                                                    324/750.19
2009/0197356 A1* 8/2009  Bang ................ H01L 21/67259
                                                    118/696
2014/0134332 A1* 5/2014  Sugino .............. C23C 16/45591
                                                    427/248.1
2018/0233396 A1* 8/2018  Matsushita ......... H01L 21/6838
2022/0068608 A1* 3/2022  Krishna ............ H01L 21/68771

FOREIGN PATENT DOCUMENTS

KR      20080017212 A    2/2008
WO      2018151971 A1    8/2018
WO      2020263939 A1    12/2020

OTHER PUBLICATIONS

PCT International Search Report and Written Opinion in PCT/US2023/029063 dated Nov. 20, 2023, 9 pages.

* cited by examiner

*Primary Examiner* — Travis M Figg
(74) *Attorney, Agent, or Firm* — Servilla Whitney LLC

(57) ABSTRACT

Processing chambers, substrate supports, centering wafers and methods of center calibrating wafer hand-off are described. A centering wafer comprises a disc-shaped body having a top surface and a bottom surface defining a thickness, a center, an outer edge having an outer peripheral face, a first arc-shaped slit and a second arc-shaped slit. Embodiments of the disclosure advantageously provide the ability to use the centering wafer to monitor and control backside pressure and thereby determine the center of a substrate support prior to processing the centering wafer. The centering wafer may be centered at a plurality of different angles by rotating the centering wafer.

12 Claims, 5 Drawing Sheets

CENTERING WAFER FOR PROCESSING CHAMBER

TECHNICAL FIELD

Embodiments of the disclosure generally relate to apparatus and methods for wafer centering. More particularly, embodiments of the disclosure are directed to centering wafers and methods of center calibrating wafer hand-off in processing chambers.

BACKGROUND

In a semiconductor wafer processing chamber, such as an atomic layer deposition (ALD) chamber, it is often useful to control the wafer (or substrate) backside pressure. Backside pressure control can be useful for a number of purposes including, but not limited to, improving temperature uniformity and wafer chucking.

Some backside pressure control uses a seal band on the pedestal surface near the wafer edge. The gas flow path goes through the pedestal to a pocket behind the wafer and into a region bounded by the seal band. Pressure control is done with a component that controls flow rate, measures pressure, and has a flow path to a pump separate from the main processing chamber region.

For backside pressure control, any features put into a pedestal will impact other design components. For example, putting a gas distribution channel in a pedestal will have a negative impact on the temperature uniformity that can be achieved with that pedestal due to, for example, design compromises including loss of direct contact between the substrate support and the wafer.

Additionally, wafer centering is one of the key variables to improve planar non-uniformity and overall non-uniformity. Ensuring that the wafer is properly seated with respect to the seal band (i.e., wafer centering) can help to improve process uniformity. In many cases, the wafer is over-compensated to improve the non-uniformity by intentionally placing the wafer off-center. This can lead to non-uniformity drift over time and will be difficult to find a specific solution path. Non-uniformity can be non-repeatable amongst various batches of processed substrates. Wafer hand-off is typically performed visually, however, this method is often inaccurate and time-consuming. Manual wafer hand-off also requires lifting the processing chamber lid, which breaks vacuum and may disrupt the wafer processing.

There is, therefore, a need in the art for methods of improving wafer hand-off in processing chambers.

SUMMARY

One or more embodiments of the disclosure are directed to a centering wafer for a processing chamber. In some embodiments, the centering wafer comprises a disc-shaped body having a top surface and a bottom surface defining a thickness, a center and an outer edge having an outer peripheral face. The centering wafer further comprises a first arc-shaped slit and a second arc-shaped slit. The first arc-shaped slit extends through the thickness of the disc-shaped body and has a first width defined by an inner edge and an outer edge. The inner edge has an inner face spaced a first distance from the center of the disc-shaped body and shaped concentric to the disc-shaped body and the outer edge has an outer face spaced a second distance from the center of the disc-shaped body and shaped concentric to the disc-shaped body. The second distance is greater than the first distance.

The first arc-shaped slit has a first length defined by a first end and a second end, the first end having a first end face, the second end having a second end face, and each of the first end and second end located at different angular orientations relative to the center of the disc-shaped body. The first arc-shaped slit is spaced a first distance from the outer peripheral face. The second arc-shaped slit extends through the thickness of the disc-shaped body and has a second width defined by an inner edge and an outer edge. The inner edge has an inner face spaced a first distance from the center of the disc-shaped body and shaped concentric to the disc-shaped body and the outer edge having an outer face spaced a second distance from the center of the disc-shaped body and shaped concentric to the disc-shaped body. The second distance is greater than the first distance. The second arc-shaped slit has a second length defined by a first end and a second end, the first end having a first end face, the second end having a second end face, each of the first end and second end located at different angular orientations relative to the center of the disc-shaped body. The second arc-shaped slit is spaced a second distance from the outer peripheral face. The second arc-shaped slit is centered angularly a distance from the first arc-shaped slit greater than the larger of the first width or second width.

Additional embodiments of the disclosure are directed to a method of center calibrating wafer hand-off in a processing chamber. In some embodiments, the method comprises positioning a centering wafer on a top surface of a substrate support in a chamber volume under controlled pressure conditions. The top surface of the substrate support has at least one gas channel with a seal band around a periphery of the top surface. The centering wafer has a disc-shaped body with a first arc-shaped slit and a second arc-shaped slit, and the first arc-shaped slit and the second arc-shaped slit have different angular positions relative to a center of the disc-shaped body. The method further comprises: determining a pressure differential between a back side and front side of the disc-shaped body; and rotating the centering wafer in intervals and measuring the pressure differential between the back side and front side of the disc-shaped body to determine the center of the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
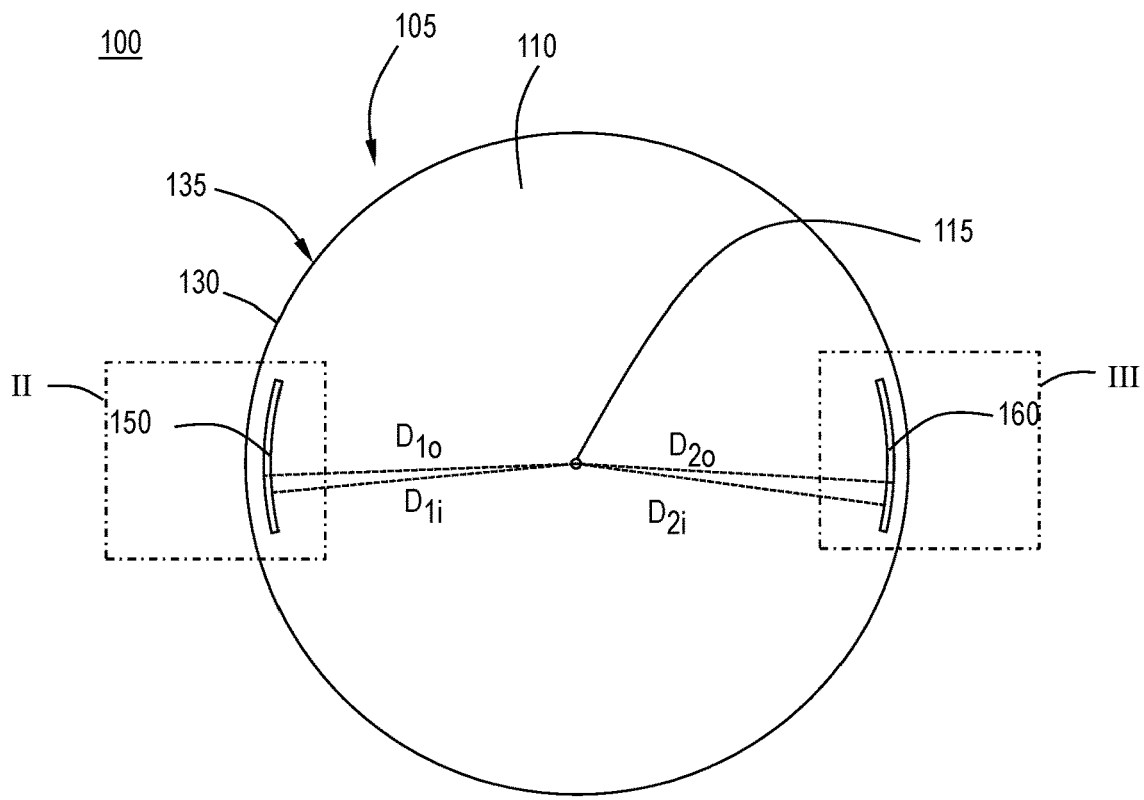
FIG. 1 illustrates a schematic top view of a centering wafer according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and appended claims, "substrate support" and "substrate support pedestal" may be used interchangeably.

As used in this specification and appended claims, use of relative terms like "above" and "below" should not be taken as limiting the scope of the disclosure to a physical orientation in space. Accordingly, use of relative terms should not be limited to the direction specified by gravity.

The use of "first" and "second" to describe the edges and sides of the components are used to denote that the components, parts or regions are different and should not be taken as limiting the scope of the disclosure to any particular physical orientation.

Embodiments of the disclosure advantageously provide a centering wafer for substrate supports and processing chambers. Embodiments of the disclosure advantageously provide the ability to use the centering wafer to monitor and control backside pressure and thereby determine the center of a substrate support prior to processing the centering wafer. Embodiments of the disclosure advantageously provide methods of center calibrating wafer hand-off using the centering wafer described herein. Without intending to be bound by any particular theory of operation, the centering wafer can be centered on a substrate support with higher accuracy than a wafer or substrate that does not have the features of the centering wafer described herein. The centering wafer may be centered at a plurality of different angles by rotating the centering wafer.

Some embodiments of the disclosure provide a substrate, or centering wafer, designed with a radial cut so that the backside pressure can be monitored to understand the centering before starting a process. When a substrate is moved from the pedestal center, gas (e.g., $Ar/N_2$) leak will happen from the process environment to the substrate backside volume. The leakage is an indication of the amount of wafer off-set from the center. Accordingly, some embodiments provide a centering wafer with two radial cuts at different angles (e.g., 180° apart) so that the centering wafer can be centered along the pedestal axis. In some embodiments, rotating the centering wafer at different angles can be used to calibrate or standardize substrate placement for future processing.

Figure 2:
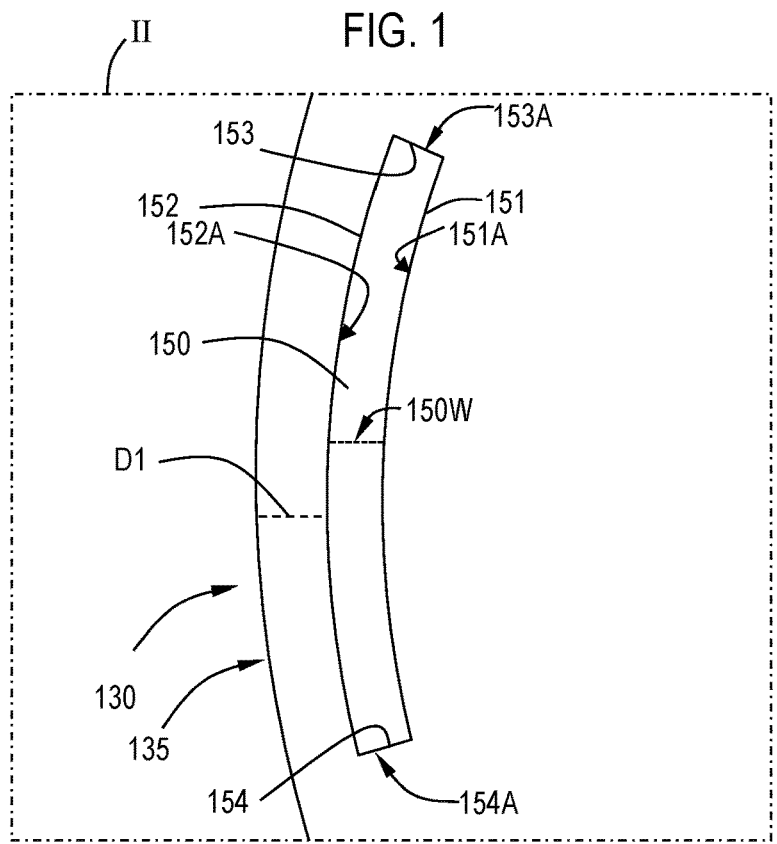
FIG. 2 illustrates an enlarged view of region II of FIG. 1.
Figure 3:
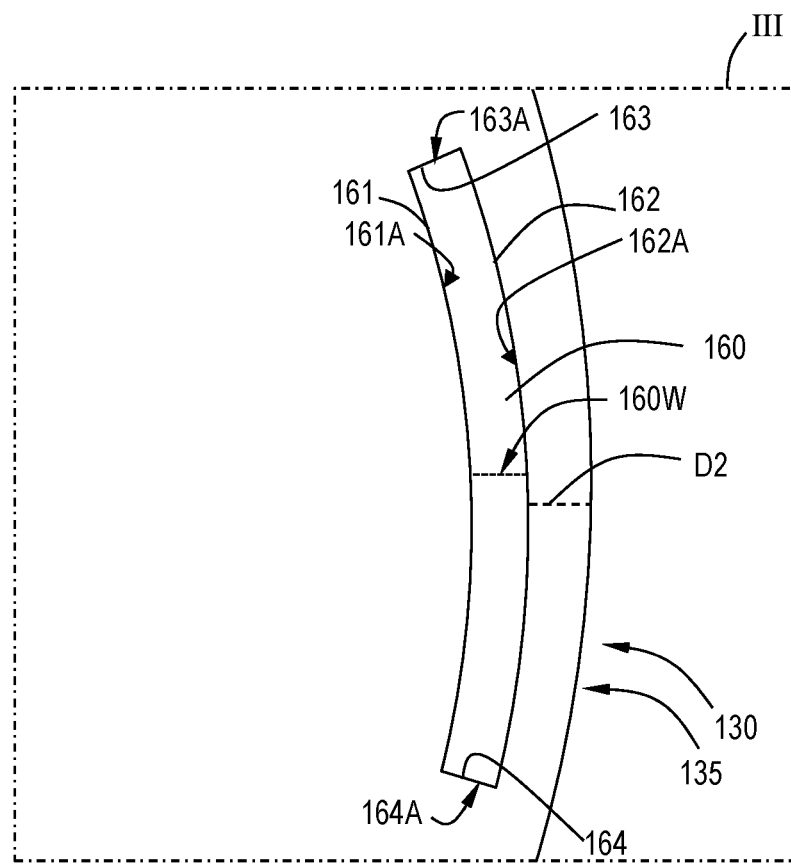
FIG. 3 illustrates an enlarged view of region III of FIG. 1.
Figure 4:
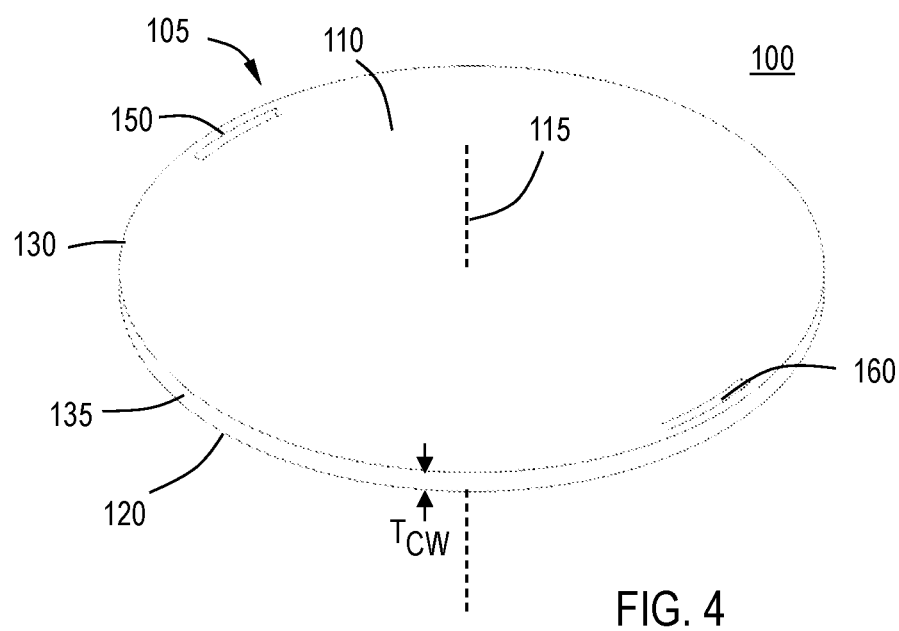
FIG. 4 illustrates an isometric view of a centering wafer according to one or more embodiments of the disclosure.
Figure 5:
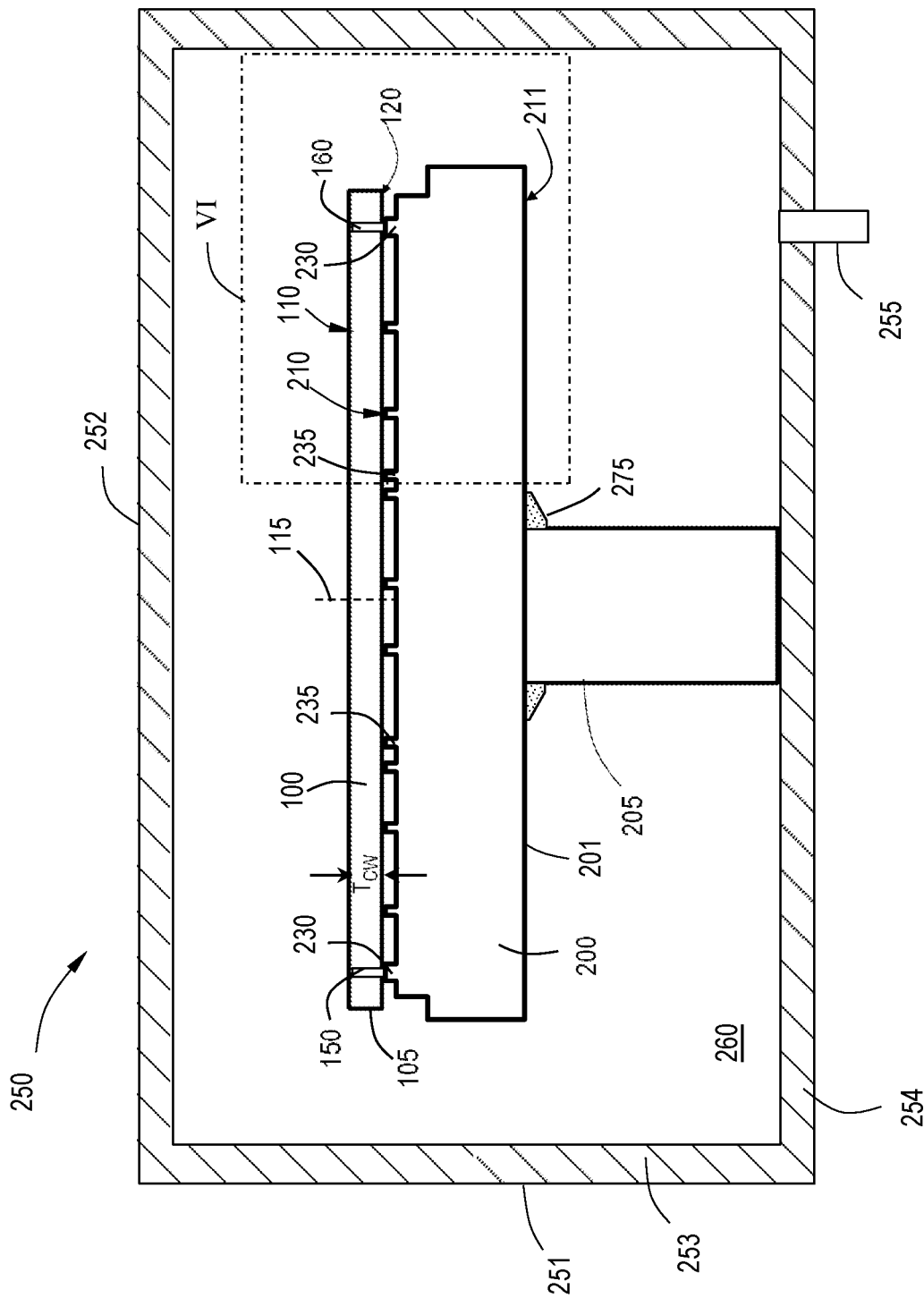
FIG. 5 illustrates a schematic cross-sectional view of a processing chamber according to one or more embodiments of the disclosure.
Figure 6:
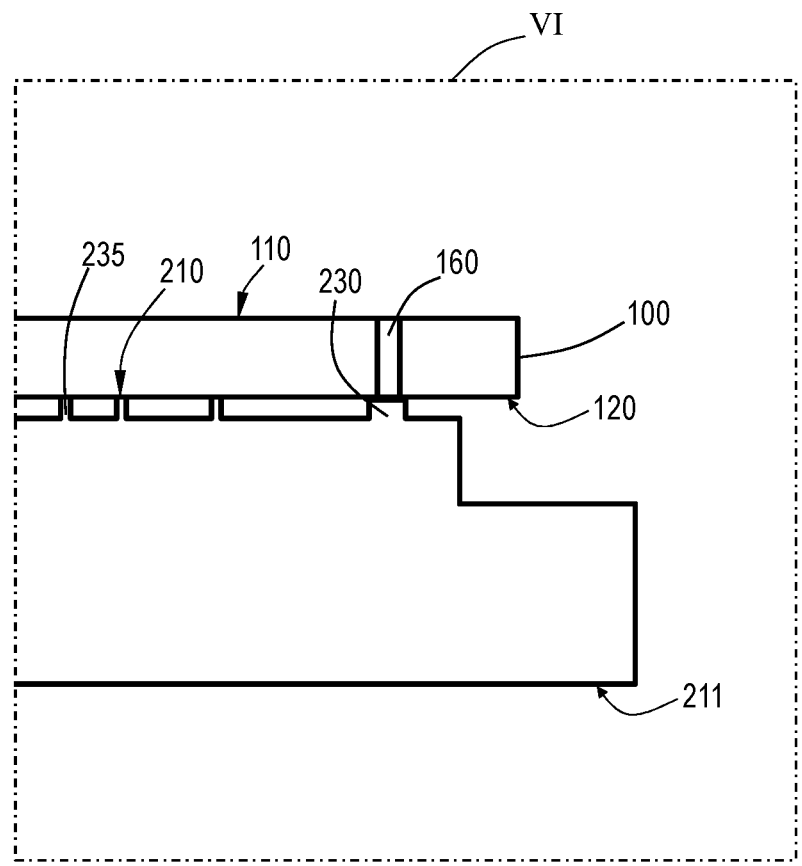
FIG. 6 illustrates an enlarged view of region VI of FIG. 5.

A centering wafer 100 may be described with respect to FIGS. 1-4. FIG. 1 illustrates a schematic top view of the centering wafer 100. FIG. 2 illustrates an enlarged view of region II of FIG. 1 showing a first arc-shaped slit 150. FIG. 3 illustrates an enlarged view of region II of FIG. 1 showing a second arc-shaped slit 160. FIG. 4 illustrates an isometric view of the centering wafer 100. The centering wafer 100 may be positioned on a substrate support 200 in a processing chamber 250, as shown in FIGS. 5-6.

Referring to FIGS. 1-4, the centering wafer 100 comprises a disc-shaped body 105 having a top surface 110 and a bottom surface 120 defining a thickness $T_{CW}$. The disc-shaped body 105 has a center 115 and an outer edge 130 with an outer peripheral face 135. The center 115 of the disc-shaped body 105 is illustrated in FIG. 1 as a circle and denoted in FIG. 4 as a dotted line; however, the skilled artisan will recognize that these illustrated of the center 115 of the disc-shaped body 105 are for descriptive purposes. The center 115 of the disc-shaped body 105 is the central axis extending normal to the top surface 110 and bottom surface 120 and does not need to include any particular indicia.

The thickness $T_{CW}$ of the disc-shaped body 105 can be any suitable thickness. For example, the thickness $T_{CW}$ of the disc-shaped body 105 can be about the same thickness as a substrate to be processed in the processing chamber. In some embodiments, the thickness $T_{CW}$ of the disc-shaped body 105 is in a range of from 0.75 mm to 2.5 mm. In some embodiments, the thickness $T_{CW}$ of the disc-shaped body 105 is 1.5 mm.

The centering wafer 100 comprises a first arc-shaped slit 150 and a second arc-shaped slit 160 extending through the thickness $T_{CW}$ of the disc-shaped body 105. The first arc-shaped slit 150 and the second arc-shaped slit 160 may be positioned at any location on and extending through the thickness $T_{CW}$ of the disc-shaped body 105. In some embodiments, the first arc-shaped slit 150 and the second arc-shaped slit 160 are on opposite sides of the disc-shaped body 105 relative to the center 115. In the illustrated embodiments of FIGS. 1-4, the first arc-shaped slit 150 is on the left side of the center 115 of the disc-shaped body 105 and the second arc-shaped slit 160 is on the right side of the center 115 of the disc-shaped body 105. The use of the ordinals 'first' and 'second', and the like, is intended for descriptive purposes to indicate a particular feature or component and should not be taken as limiting the scope of the disclosure. For example, in one or more unillustrated embodiments, the first arc-shaped slit 150 is on the right side of the center 115 of the disc-shaped body 105 and the second arc-shaped slit 160 is on the left side of the center 115 of the disc-shaped body 105.

Referring to FIG. 2, in some embodiments, the first arc-shaped slit 150 has a first width 150W defined by an inner edge 151 and an outer edge 152. In some embodiments, the first width 150W is in a range of from 15 mils to 25 mils. In some embodiments, the first width 150W is 20 mils. Stated differently, the first width 150W of the first arc-shaped slit 150 is measured along a path extending from the central axis 115 of the disc-shaped body 105.

The first arc-shaped slit 150 illustrated in FIG. 2 has a substantially uniform width across the length of the slit; however, this is merely representative of one possible configuration and should not be taken as limiting the scope of the disclosure. In some embodiments, the width of the slit can vary along the length of the slit from end-to-end. In embodiments of this sort, the width of the slit is measured as the average width along the length.

The inner edge 151 has an inner face 151A spaced a first distance $D_{1i}$ from the center 115 of the disc-shaped body 105 and shaped concentric to the disc-shaped body 105. The outer edge 152 has an outer face 152A spaced a second distance $D_{1o}$ from the center 115 of the disc-shaped body 105 and shaped concentric to the disc-shaped body 105. In some embodiments, the second distance $D_{1o}$ is greater than the first distance $D_{1i}$. Stated differently, in some embodiments, the inner face 151A of the inner edge 151 is closer to the center 115 than the outer face 152A of the outer edge 152.

In some embodiments, the distance of the inner face 151A of the inner edge 151 to the center 115 (the first distance $D_{1i}$) is in a range of from 500 mils to 1500 mils, or in the range of from 600 mils to 1400 mils, in the range of from 700 mils to 1300 mils, or in the range of from 800 mils to 1200 mils. In some embodiments, the distance of the outer face 152A of the outer edge 152 to the center 115 (the second distance $D_{1o}$) is in a range of from 525 mils to 1525 mils, or in the range of from 550 mils to 100 mils, in the range of from 600 mils to 1400 mils, in the range of from 700 mils to 1300 mils, or in the range of from 800 mils to 1200 mils.

The first arc-shaped slit 150 has a first length defined by a first end 153 and a second end 154. In some embodiments, the first length is in a range of from 5 mm to 15 mm. In some embodiments, the first length is 10 mm. The first end 153 has a first end face 153A and the second end 154 has a second end face 154A. In some embodiments, each of the first end 153 and second end 154 located at different angular orientations relative to the center 115 of the disc-shaped body 105.

The inner edge 151, the outer edge 152, the first end 153, and the second end 154 define an area of the first arc-shaped slit 150. In some embodiments, the area of the first arc-shaped slit 150 is in a range of from 10 mm$^2$ to 15 mm$^2$. In some embodiments, the area of the first arc-shaped slit 150 is 12 mm$^2$.

The first arc-shaped slit 150 is spaced a first distance D1 from the outer peripheral face 135. More particularly, the outer edge 152 of the first arc-shaped slit 150 is spaced the first distance D1 from the outer peripheral face 135. In some embodiments, the first distance D1 is in a range of from 50 mils to 150 mils. In some embodiments, the first distance D1 is 100 mils.

In some embodiments, the second arc-shaped slit 160 has the same or similar physical characteristics (including physical dimensions) as the first arc-shaped slit 150.

Referring to FIG. 3, in some embodiments, the second arc-shaped slit 160 has a second width 160W defined by an inner edge 161 and an outer edge 162. In some embodiments, the first width 150W of the first arc-shaped slit 150 is equal to the second width 160W of the second arc-shaped slit 160. In some embodiments, the second width 160W is in a range of from 15 mils to 25 mils. In some embodiments, the second width 160W is 20 mils. Stated differently, the second width 160W of the second arc-shaped slit 160 is measured along a path extending from the central axis 115 of the disc-shaped body 105.

The second arc-shaped slit 160 illustrated in FIG. 3 has a substantially uniform width across the length of the slit; however, this is merely representative of one possible configuration and should not be taken as limiting the scope of the disclosure. In some embodiments, the width of the slit can vary along the length of the slit from end-to-end. In embodiments of this sort, the width of the slit is measured as the average width along the length.

The inner edge 161 has an inner face 161A spaced a first distance $D_{2i}$ from the center 115 of the disc-shaped body 105 and shaped concentric to the disc-shaped body 105. The outer edge 162 has an outer face 162A spaced a second distance $D_{2o}$ from the center 115 of the disc-shaped body 105 and shaped concentric to the disc-shaped body 105. In some embodiments, the second distance $D_{2o}$ is greater than the first distance $D_{2i}$. Stated differently, in some embodiments, the inner face 161A of the inner edge 161 is closer to the center 115 than the outer face 162A of the outer edge 162.

In some embodiments, the distance of the inner face 161A of the inner edge 161 to the center 115 (the first distance $D_{2i}$) is in a range of from 500 mils to 1500 mils, or in the range of from 600 mils to 1400 mils, in the range of from 700 mils to 1300 mils, or in the range of from 800 mils to 1200 mils. In some embodiments, the distance of the outer face 162A of the outer edge 162 to the center 115 (the second distance $D_{2o}$) is in a range of from 525 mils to 1525 mils, or in the range of from 550 mils to 100 mils, in the range of from 600 mils to 1400 mils, in the range of from 700 mils to 1300 mils, or in the range of from 800 mils to 1200 mils.

The second arc-shaped slit 160 has a second length defined by a first end 163 and a second end 164. In some embodiments, the first length of the first arc-shaped slit 150 is equal to the second length of the second arc-shaped slit 160. In some embodiments, the second length is in a range of from 5 mm to 15 mm. In some embodiments, the second length is 10 mm. The first end 163 has a first end face 163A and the second end 164 has a second end face 164A. In some embodiments, each of the first end 163 and second end 164 located at different angular orientations relative to the center 115 of the disc-shaped body 105.

The inner edge 161, the outer edge 162, the first end 163, and the second end 164 define an area of the second arc-shaped slit 160. In some embodiments, the area of the first arc-shaped slit 150 is equal to the area of the second arc-shaped slit 160. In some embodiments, the area of the second arc-shaped slit 160 is in a range of from 10 mm$^2$ to 15 mm$^2$. In some embodiments, the area of the second arc-shaped slit 160 is 12 mm$^2$.

The second arc-shaped slit 160 is spaced a second distance D2 from the outer peripheral face 135. More particularly, the outer edge 162 of the second arc-shaped slit 160 is spaced the second distance D2 from the outer peripheral face 135. In some embodiments, the first distance D1 (e.g., the distance between the outer edge 152 of the first arc-shaped slit 150 from the outer peripheral face) is equal to the second distance D2. In some embodiments, the second distance D2 is in a range of from 50 mils to 150 mils. In some embodiments, the second distance D2 is 100 mils.

In some embodiments, the second arc-shaped slit 160 is centered angularly a distance from the first arc-shaped slit 150 greater than the larger of the first width 150W or second width 160W. In some embodiments, each of the first width 150W and the second width 160W is in a range of from 15 mils to 25 mils. the second arc-shaped slit 160 is centered angularly a distance of in the range of from 15 mils to 25 mils from the first arc-shaped slit 150.

The disclosure provides methods 400 of center calibrating wafer hand-off for use in a single wafer processing chamber 250. FIG. 5 illustrates a schematic cross-sectional view of the processing chamber 250. FIG. 6 shows an enlarged view of region VI of the processing chamber 250 of FIG. 5. The enlarged view of FIG. 6 illustrates the centering wafer 100 on a substrate support 200.

The processing chamber 250 has a chamber body 251 with a top wall 252 (i.e., a processing chamber lid), at least one sidewall 253 and a bottom 254. The chamber body 251 along with the top wall 252 define an interior volume 260.

Referring to FIGS. 5-6, the processing chamber 250 has a substrate support 200 within the interior volume 260. The substrate support 200 comprises a support shaft 205, a support body 201 having a top surface 210 and a back surface 211 defining a thickness of the support body 201, and a heater (not shown) within the thickness of the support body 201. The heater can be any suitable heater known to the skilled artisan including, but not limited to, resistive heater. In some embodiments, the support body 201 comprises an electrostatic chuck and includes one or more electrodes for chucking a wafer to the top surface 210. In some embodiments, the thickness of the support body 201 is in a range of from 0.25 inches to 1 inch.

The top surface 210 of the substrate support 200 has at least one gas channel (not shown) with a seal band 230 around a periphery of the top surface 210.

The seal band 124 of some embodiments is connected to a vacuum source (not shown). In some embodiments, the seal band 230 is connected to a purge gas source instead of a vacuum source to provide a flow of backside purge gas to a substrate (e.g., the centering wafer 100) on the top surface 210. In some embodiments, a bevel purge capability is included which directs gas flow to the outer edge 130 of the centering wafer 100). In some embodiments, a purge gas is flows around the heater to protect the heater surfaces from deposition to avoid long-term performance deterioration.

The substrate support 200 comprises a plurality of mesas 235. The top surface 210 of the mesas 235 acts as the top surface 210 of the substrate support 200. In some embodiments, the plurality of mesas 235 is formed within the seal band 230 around the periphery of the top surface 210. In some embodiments, the mesas 235 have a height in a range of about 10 µm to about 40 µm, or in the range of about 12.5 µm to about 35 µm, or about 15 µm to about 30 µm.

In some embodiments, the first arc-shaped slit 150 and the second arc-shaped slit 160 are positioned over the seal band 230. Without intending to be bound by any particular theory of operation, the seal band 230 creates a seal between one or more of the first arc-shaped slit 150 or the second arc-shaped slit 160 to prevent gas leak.

In some embodiments, the substrate support 200 comprises a support bracket 275 to support the centering wafer 100. The support bracket 275 may be any suitable support mechanism known to the skilled artisan. The support bracket 275 of some embodiments comprises a split body design allowing the support bracket 275 to be positioned around an existing support shaft 205.

The processing chamber 250 typically includes a vacuum source (not shown) connected to an exhaust port 255 for maintaining a reduced pressure state within the interior volume 260.

Figure 7:
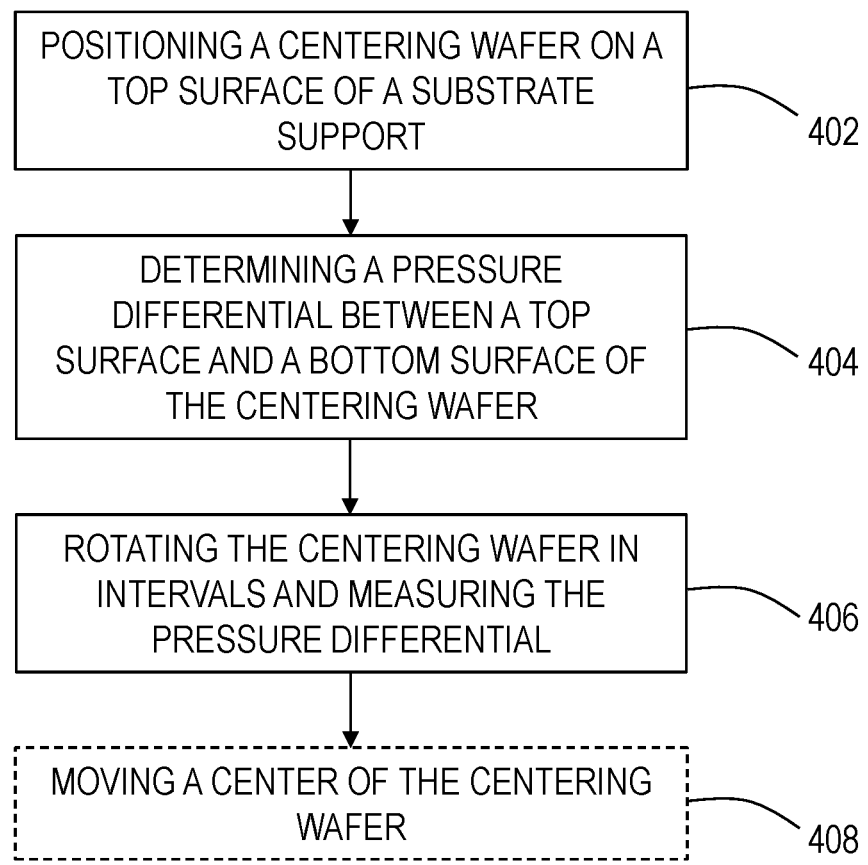
FIG. 7 illustrates a process flow diagram of a method according to one or more embodiments of the disclosure.

FIG. 7 illustrates a process flow diagram of a method 400 of center calibrating wafer hand-off in a processing chamber (e.g., processing chamber 250 as shown in FIGS. 5-6). The method 400 comprises, at operation 402, positioning a centering wafer 100 (as illustrated in FIGS. 1-4) on a top surface 210 of a substrate support 200 in a chamber volume 209 under controlled pressure conditions. As used herein, "controlled pressure conditions" means that the conditions within the interior volume 260 of the processing chamber 250 are repeatable and may include a vacuum environment while the environment outside of the chamber body 251 is an atmospheric environment.

The first arc-shaped slit 150 and the second arc-shaped slit 160 have different angular positions relative to the center 115 of the disc-shaped body 105. In some embodiments, the second arc-shaped slit 160 is centered angularly a distance from the first arc-shaped slit 150 greater than the larger of the first width 150W or second width 160W. In some embodiments, each of the first width 150W and the second width 160W is in a range of from 15 mils to 25 mils. the second arc-shaped slit 160 is centered angularly a distance of in the range of from 15 mils to 25 mils from the first arc-shaped slit 150.

The method 400 comprises, at operation 404, determining a pressure differential between a top surface 110 and a bottom surface 120 of the disc-shaped body 105. The pressure differential may be measured by any process known to the skilled artisan. When a substrate is moved from the pedestal center, gas (e.g., Ar/N$_2$) leak will happen from the process environment to the substrate backside volume. The leakage is an indication of the amount of wafer off-set from the center.

The method 400 comprises, at operation 406, rotating the centering wafer 100 in intervals and measuring the pressure differential between the top surface 110 and the bottom surface 120 of the disc-shaped body 105 to determine the center of the substrate support 200. In the illustrated embodiments of FIGS. 1-4, the first arc-shaped slit 150 is on the left side of the disc-shaped body 105 and the second arc-shaped slit 160 is on the right side of the disc-shaped body 105. In some embodiments, at operation 406, rotating the centering wafer in intervals changes the location of the first arc-shaped slit 150 and the second arc-shaped slit 160. In some embodiments, at operation 406, rotating the centering wafer in intervals comprises rotating the centering wafer a factor of 360° in a counter-clockwise direction. In some embodiments, at operation 406, rotating the centering wafer a factor of 360° in a counter-clockwise direction includes one or more of 1°, 2°, 3°, 4°, 5°, 6°, 8°, 9°, 10°, 12°, 15°, 18°, 20°, 24°, 30°, 36°, 40°, 45°, 60°, 72°, 90°, 120°, 180°, or 360° rotations. In some embodiments, at operation 406, rotating the centering wafer in intervals comprises rotating the centering wafer 10° in a counter-clockwise direction. In some embodiments, at operation 406, rotating the centering wafer in intervals comprises rotating the centering wafer 10° in a counter-clockwise direction includes one or more of 10°, 20°, 30°, 40°, 50°, 60°, 70°, 80°, 90°, 100°, 110°, 120°, 130°, 140°, 150°, 160°, 170°, 180°, 190°, 200°, 210°, 220°, 230°, 240°, 250°, 260°, 270°, 280°, 290°, 300°, 310°, 320°, 330°, 340°, 350°, or 360° rotations.

In some embodiments, the method 400 optionally includes, at operation 408, moving the center 115 of the disc-shaped body 105 of the centering wafer 100 on the substrate support 200 to position the first arc-shaped slit 150 and the second arc-shaped slit 160 over the seal band 230.

Without intending to be bound by any particular theory of operation, the seal band 230 creates a seal between the first arc-shaped slit 150 and the second arc-shaped slit 160 to prevent gas leak.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A centering wafer comprising:
    a disc-shaped body having a top surface and a bottom surface defining a thickness, a center and an outer edge having an outer peripheral face; and
    a plurality of arc-shaped slits extending through the thickness of the disc-shaped body, the plurality of arc-shaped slits including a first arc-shaped slit and a second arc-shaped slit, the first arc-shaped slit having a first width defined by an inner edge and an outer edge, the inner edge having an inner face spaced a first distance from the center of the disc-shaped body and shaped concentric to the disc-shaped body, the outer edge having an outer face spaced a second distance from the center of the disc-shaped body and shaped concentric to the disc-shaped body, the second distance being greater than the first distance, the first arc-shaped slit having a first length defined by a first end and a second end, the first end having a first end face, the second end having a second end face, each of the first end and second end located at different angular orientations relative to the center of the disc-shaped body, the first arc-shaped slit spaced a first distance from the outer peripheral face, and
    the second arc-shaped slit having a second width defined by an inner edge and an outer edge, the inner edge having an inner face spaced a first distance from the center of the disc-shaped body and shaped concentric to the disc-shaped body, the outer edge having an outer face spaced a second distance from the center of the disc-shaped body and shaped concentric to the disc-shaped body, the second distance being greater than the first distance, the second arc-shaped slit having a second length defined by a first end and a second end, the first end having a first end face, the second end having a second end face, each of the first end and second end located at different angular orientations relative to the center of the disc-shaped body, the second arc-shaped slit spaced a second distance from the outer peripheral face, the second arc-shaped slit centered angularly a distance from the first arc-shaped slit greater than the larger of the first width or second width, the first arc-shaped slit and the second arc-shaped slit on opposite sides of the disc-shaped body, wherein the disc-shaped body does not include any other slits other than the first arc-shaped slit and the second arc-shaped slit.

2. The centering wafer of claim 1, wherein each of the first width of the first arc-shaped slit and the second width of the second arc-shaped slit independently comprises a width in a range of from 15 mils to 25 mils.

3. The centering wafer of claim 2, wherein each of the first width of the first arc-shaped slit and the second width of the second arc-shaped slit independently comprises a width of 20 mils.

4. The centering wafer of claim 2, wherein the first width of the first arc-shaped slit is equal to the second width of the second arc-shaped slit.

5. The centering wafer of claim 1, wherein each of the first length of the first arc-shaped slit and the second length of the second arc-shaped slit independently comprises a length of 5 mm to 15 mm.

6. The centering wafer of claim 5, wherein the first length of the first arc-shaped slit is equal to the second length of the second arc-shaped slit.

7. The centering wafer of claim 1, wherein the inner edge, outer edge, first end and second end of each of the first arc-shaped slit and the second arc-shaped slit define an area of each of the first arc-shaped slit and the second arc-shaped slit.

8. The centering wafer of claim 7, wherein the area of each of the first arc-shaped slit and the second arc-shaped slit is in a range of from 10 $mm^2$ to 15 $mm^2$.

9. The centering wafer of claim 8, wherein the area of each of the first arc-shaped slit and the second arc-shaped slit is 12 $mm^2$.

10. The centering wafer of claim 1, wherein each of the first distance and the second distance is in a range of from 50 mils to 150 mils.

11. The centering wafer of claim 1, wherein the thickness of the disc-shaped body is in a range of from 0.75 mm to 2.5 mm.

12. The centering wafer of claim 11, wherein the thickness of the disc-shaped body is 1.5 mm.

* * * * *